United States Patent
Min et al.

(10) Patent No.: US 7,578,944 B2
(45) Date of Patent: Aug. 25, 2009

(54) APPARATUS FOR GENERATING GAS PLASMA, GAS COMPOSITION FOR GENERATING PLASMA AND METHOD FOR MANUFACTURING SEMICONDUCTOR DEVICE USING THE SAME

(75) Inventors: Young-Min Min, Seongnam-si (KR); Dae-Kyu Choi, Suwon-si (KR); Do-In Bae, Changwon-si (KR); Yun-Sik Yang, Suwon-si (KR); Wan-Goo Hwang, Yongin-si (KR); Jin-Man Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 299 days.

(21) Appl. No.: 11/271,835

(22) Filed: Nov. 14, 2005

(65) Prior Publication Data
US 2006/0084269 A1 Apr. 20, 2006

Related U.S. Application Data

(62) Division of application No. 10/368,344, filed on Feb. 20, 2003, now Pat. No. 7,193,369.

(30) Foreign Application Priority Data
Nov. 11, 2002 (KR) ............................... 2002-69776

(51) Int. Cl.
*H01L 21/302* (2006.01)
(52) U.S. Cl. ........................................ 216/67; 438/710
(58) Field of Classification Search .................. 216/67, 216/76; 438/706
See application file for complete search history.

(56) References Cited

U.S. PATENT DOCUMENTS

| 4,213,043 | A | | 7/1980 | Dawson |
| 4,797,178 | A | * | 1/1989 | Bui et al. ..................... 134/1.1 |
| 4,810,935 | A | | 3/1989 | Boswell |

(Continued)

FOREIGN PATENT DOCUMENTS

| DE | 19938824 A1 | 9/2001 |
| DE | 10102745 A1 | 8/2002 |
| EP | 8323873 | 12/1996 |
| EP | 0 898 308 A2 | 2/1999 |
| JP | 58192390 A | 11/1983 |

(Continued)

OTHER PUBLICATIONS

Korean Office Action dated Oct. 28, 2004.
English translation of Korean Office Action dated Oct. 28, 2004.
Chinese Office Action dated Apr. 24, 2009, in corresponding Chinese Application No. 97132168.

*Primary Examiner*—Keith D Hendricks
*Assistant Examiner*—Patricia A George
(74) *Attorney, Agent, or Firm*—Harness, Dickey & Pierce, P.L.C.

(57) ABSTRACT

A method for manufacturing a semiconductor device may include: forming a main magnetic field having an axis, and forming a subsidiary magnetic field substantially parallel to the axis; applying an alternating current along a path between the main and the subsidiary magnetic fields; allowing a gas to flow along a flow path along the path of the current so that a gas plasma is generated from the gas; providing the gas plasma into a chamber separated from a position where the gas plasma is generated; and performing a process for manufacturing a semiconductor device by employing the gas plasma.

11 Claims, 13 Drawing Sheets

U.S. PATENT DOCUMENTS

| | | |
|---|---|---|
| 4,996,077 A * | 2/1991 | Moslehi et al. .............. 427/562 |
| 5,260,600 A * | 11/1993 | Harada ....................... 257/639 |
| 5,270,515 A | 12/1993 | Long |
| 5,458,754 A | 10/1995 | Sathrum et al. |
| 5,648,701 A | 7/1997 | Hooke et al. |
| 6,001,420 A | 12/1999 | Mosely et al. |
| 6,204,510 B1 | 3/2001 | Ohkawa |
| 6,263,830 B1 | 7/2001 | Kamarehi et al. |
| 6,391,769 B1 | 5/2002 | Lee et al. |
| 6,392,351 B1 | 5/2002 | Shun'ko |
| 6,414,648 B1 | 7/2002 | Holland et al. |
| 6,432,820 B1 | 8/2002 | Lee et al. |
| 6,692,622 B1 | 2/2004 | Colpo et al. |
| 2002/0009885 A1 | 1/2002 | Branker et al. |
| 2003/0071035 A1 | 4/2003 | Brailove |
| 2003/0168430 A1 * | 9/2003 | Shyu et al. .................... 216/67 |

FOREIGN PATENT DOCUMENTS

| | | |
|---|---|---|
| JP | 6293980 | 10/1994 |
| JP | 11288923 A | 10/1999 |
| KR | 1998079855 | 11/1998 |
| KR | 20010049697 | 6/2001 |
| KR | 1020020061451 | 7/2002 |
| KR | 10-2003-0017729 | 3/2003 |
| KR | 1020030017729 A | 3/2003 |
| TW | 503433 | 9/2002 |

* cited by examiner

FIG. 2
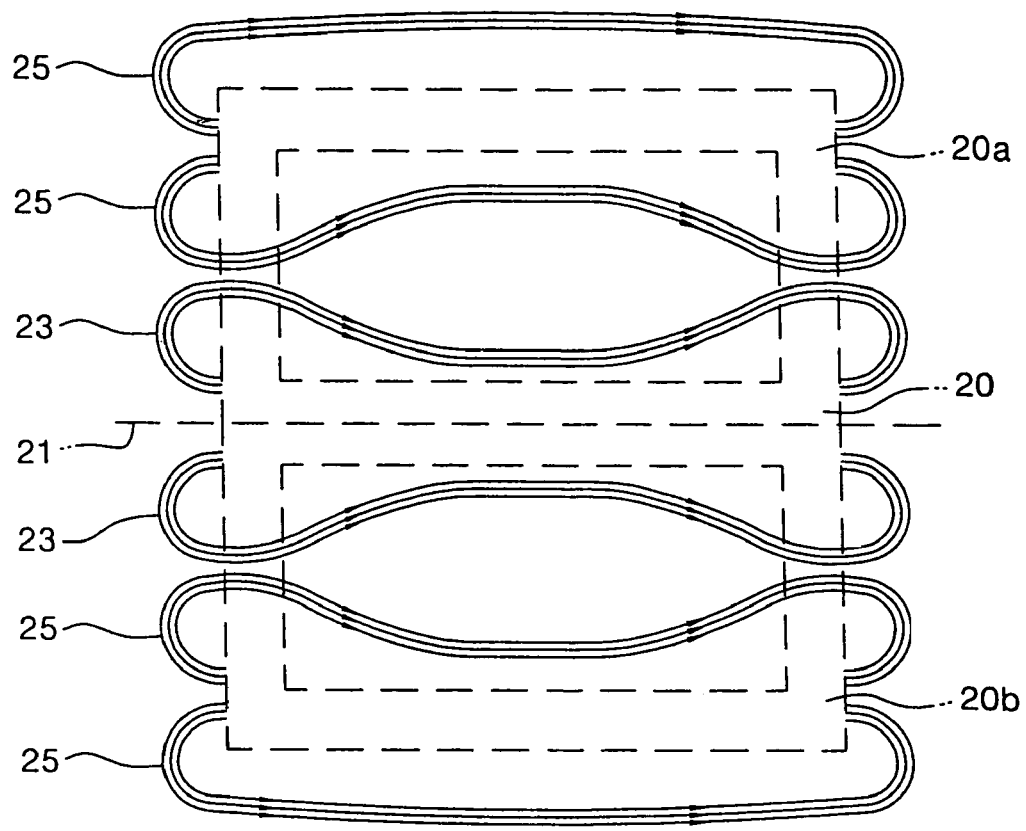
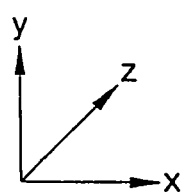

APPARATUS FOR GENERATING GAS PLASMA, GAS COMPOSITION FOR GENERATING PLASMA AND METHOD FOR MANUFACTURING SEMICONDUCTOR DEVICE USING THE SAME

This U.S. nonprovisional patent application is a divisional application that claims priority under 35 U.S.C. § 120 upon U.S. patent application No. 10/368,344, filed Feb. 20, 2003, now U.S. Pat. No. 7,193,369, and claims priority under 35 U.S.C. § 119 upon Korean Patent Application 2002-69776 filed on Nov. 11, 2002, the entire contents of each of which are hereby incorporated by reference.

BACKGROUND OF THE INVENTION

The present invention relates to generating a plasma using a gas composition for manufacturing a semiconductor device; more particularly, a method and an apparatus for generating a plasma using a remote process, a gas composition for generating the plasma to etch a layer, and a method for manufacturing a semiconductor device using the gas composition.

Recently, semiconductor devices have been rapidly developed in order to meet various requirements of consumers and the development of information processing devices. The semiconductor devices are required to have high operation speed and large storage capacity. Thus, the semiconductor devices should be highly integrated with a design rule of below 0.15 μm. As a result, the semiconductor manufacturing processes has progressed to employing a plasma in the micro machining technology process.

Processes for generating plasma are divided into an in-situ process and a remote process, depending on the plasma type. The in-situ process generates the plasma in a chamber used for manufacturing a semiconductor device. On the other hand, the remote process inserts the plasma into the chamber after the plasma is generated outside the chamber. Utilizing the in-situ process, a substrate positioned in the chamber and the inside of the chamber may be damaged because the plasma is directly generated in the chamber. Hence, the remote process is more often employed in recent semiconductor manufacturing processes.

Examples of methods and apparatus for generating a plasma by a remote process are disclosed in Korean Laid Open Patent Publication No. 1998-79855, Korean Laid Open Patent Publication No. 2001-49697, U.S. Pat. No. 5,458,754 (issued to Sathrum el al.), U.S. Pat. No. 6,263,830 (issued to Kamarehi el al.), Japanese Laid Open Patent Publication No. 6-293980, and Japanese Laid Open Patent Publication No. 8-323873.

U.S. Pat. No. 5,458,754 discloses a method for generating a plasma by utilizing a magnetic field. U.S. Pat. No. 6,263,830 discloses a method for generating a plasma by applying microwaves. Whether employing the magnetic field or the microwave, the generation efficiency of the plasma can be improved by controlling the motion of the plasma when the plasma is generated.

FIG. 1 is a schematic view illustrating an apparatus for generating a plasma by a conventional remote process using a magnetic field.

Referring to FIG. 1, a plasma generating apparatus 1 has a tube 11 in which a gas flows. The tube 11 is divided into a first bifurcated tube 11a and a second bifurcated tube 11b at the portion of tube 11 where a source gas flows. The first and second bifurcated tubes 11a and 11b are combined at the portion of tube 11 where a plasma gas is exhausted. The source gas passes through two paths $P_1$ and $P_2$, and is changed into a gas having a plasma state.

The plasma generating apparatus 1 includes a magnetic field generating member 13 for generating a magnetic field to transform the gas into plasma. The magnetic field generating member 13 is disposed to enclose the first bifurcated tube 11a, but can be disposed to enclose the second. bifurcated tube 11b.

A power source 15 generates spherical wave high frequency alternating current to generate electric and magnetic fields to change the gas into plasma. Electrical wiring connected to the power source 15 is disposed as a coil to enclose the magnetic field generating member 13.

When the high frequency alternating current generated from the power source 15 is applied to pass through the magnetic field generating member 13, energy is applied to gas particles in the tube 11, thereby generating the plasma.

In the above-described conventional plasma generating apparatus 1, the energy induced from a core portion of the magnetic field generating member 13 (the portion where the coil is positioned) is transferred to the first bifurcated tube 11a of the tube 11. An induction electric field is formed at path $P_1$. Path $P_2$ serves as a secondary winding.

The gas flows through the two paths $P_1$ and $P_2$. The electric field directly generated from the power source 15 is applied to one path $P_1$ of the two paths $P_1$ and $P_2$, while the induction electric field induced from the electric field of the power source 15 by the coil is applied to the other path $P_2$. Thus, some energy is transferred to the gas in the second bifurcated tube 11b.

When the induction electric field is employed, the energy cannot be sufficiently applied to the gas particles in the tube 11 due to power loss. Thus, the generation efficiency of the plasma may be reduced. To enhance the generation efficiency of the plasma, a large amount of gas can be used in the plasma generating apparatus. However, the manufacturing cost may greatly increase when the plasma generating apparatus consumes the gas on a massive scale.

Though a perfluorocarbon based gas is usually employed for manufacturing a semiconductor device and is chemically stable, the perfluorocarbon-based gas is a gas that may increase the green house effect. Hence, the exhaustion quantity of the perfluorocarbon-based gas should be reduced when the perfluorocarbon-based gas is employed for manufacturing the semiconductor device. Various methods, having no effect on the productivity of the semiconductor device, have been developed in order to reduce the exhaustion quantity of the perfluorocarbon-based gas. One example is a method utilizing an $NF_3$ gas for generating the plasma to form fluorine radicals during the process for cleaning the semiconductor device. However, $NF_3$ gas is expensive, so the manufacturing cost of the semiconductor device may increase.

SUMMARY OF THE INVENTION

In an exemplary embodiment, the present invention is directed to a method for generating a plasma, which can improve the generation efficiency of the plasma when the plasma is generated by a remote process.

In another exemplary embodiment the present invention is directed to an apparatus for generating a plasma, which can be employed for the above-mentioned method for generating the plasma.

In another exemplary embodiment, the present invention is directed to a gas composition for etching a layer, which can be used for generating the plasma.

In another exemplary embodiment, the present invention is directed to a method of manufacturing a semiconductor device using the gas composition.

In another exemplary embodiment, the present invention is directed to a plasma generating method where, after a main magnetic field having an axis is formed, a subsidiary magnetic field is formed in parallel to or substantially parallel to the axis. Electric power is provided so that a high frequency alternating current is applied along a path between the main and the subsidiary magnetic fields. A gas flows along a path of the current so that the gas is transformed into a plasma state.

In another exemplary embodiment, after a main magnetic field having an axis is formed, gas flows in the magnetic field along a first direction perpendicular to or substantially perpendicular to the axis. An electric field is applied to the gas along a second direction, different from the first direction, so that a plasma is generated from the gas.

Another exemplary embodiment of the present invention is directed to an apparatus for generating a plasma having magnetic field generating means, and plasma generating means. The magnetic field generating means generates a main magnetic field having an axis and a subsidiary magnetic field parallel to the axis. The plasma generating means generates a plasma from a gas by allowing the gas to flow in a region between the main and the subsidiary magnetic fields. The plasma generating means may apply a high frequency alternating current along a path parallel to or substantially parallel to a flow path of the gas.

In another exemplary embodiment, the present invention is directed to a gas composition for generating a plasma comprising $C_3F_8$ gas, oxygen gas, and argon gas.

In another exemplary embodiment, the present invention is directed to a method which etches a device using the gas plasma generated from a mixture of $C_3F_8$ gas, oxygen gas, and argon gas using a remote plasma process.

According to another exemplary embodiment of the present invention, the motion of the gas plasma can be effectively controlled using a main and subsidiary magnetic field. Also, because the high frequency alternating current can be applied along the path identical to or substantially identical to the flow path of the gas, free electrons for ionizing the gas can be accelerated, efficiently therefore, the generation efficiency of the plasma can be improved. Further, the gas composition for generating the plasma is inexpensive, and the generation efficiency of the plasma can be increased using a quantity of the gas composition, which may reduce the manufacturing cost of the semiconductor device.

BRIEF DESCRIPTION OF THE DRAWINGS

The above and other advantages of exemplary embodiments of the present invention will become more apparent by describing in detail exemplary embodiments thereof with reference to the accompanying drawings, in which:

FIG. 2 is a view illustrating the main and the subsidiary magnetic fields used in an exemplary embodiment of the present invention;

Figure 1:
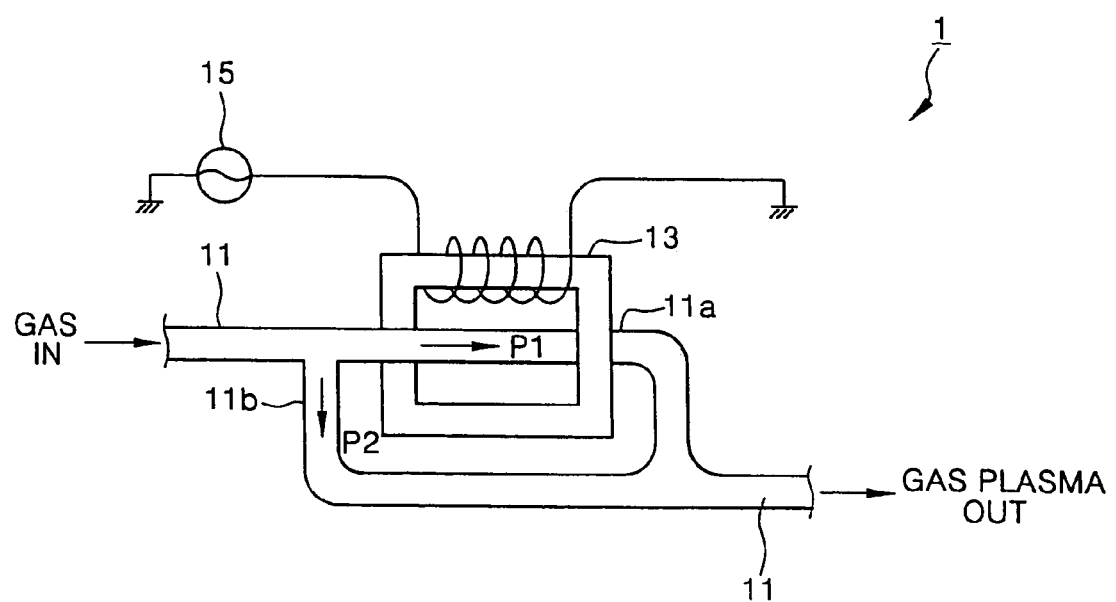
FIG. 1 is a schematic view illustrating an apparatus for generating a plasma employing a conventional remote plasma process.

DESCRIPTION OF EXEMPLARY
EMBODIMENTS OF THE PRESENT
INVENTION

Hereinafter, exemplary embodiments of the present invention will be described in detail with reference to the accompanying drawings. In the following drawings, like reference numerals identify similar or identical elements.

Method and Apparatus for Generating a Plasma

FIG. 2 is a schematic view illustrating the main and the subsidiary magnetic fields used in an exemplary embodiment of the present invention. The main and the subsidiary electric fields may be generated by one or more magnetic field generating elements.

Referring to FIG. 2, a main magnetic field generating member 20 generates the main magnetic field 23 formed along the axis 21 of the main magnetic field generating member 20 (for example, an X-axis direction). First and second subsidiary magnetic field generating members 20a and 20b may be disposed parallel to or substantially parallel to the main magnetic field generating member 20. The main magnetic field generating member 20 is positioned between the first and second subsidiary magnetic field generating members 20a and 20b. The first and the second subsidiary magnetic field generating members 20a and 20b generate subsidiary magnetic fields 25, respectively. The subsidiary magnetic fields 25 are formed to be parallel to or substantially parallel to the axis 21 of the main magnetic field generating member 20. Thus, the subsidiary magnetic fields 25 are parallel to or substantially parallel to the main magnetic field 23.

Repulsive forces are generated between the main and the subsidiary magnetic fields 23 and 25 so that the densities of magnetic fluxes increase along the axis 21 in the spaces between the main magnetic field generating member 20 and the first and second magnetic field generating members 20a and 20b, respectively.

The subsidiary magnetic fields 25 may be symmetrically formed with respect to the main magnetic field 23. As shown in FIG. 2, though the subsidiary magnetic fields 25 can be generated by employing the first and second subsidiary magnetic field generating members 20a and 20b, two pairs of subsidiary magnetic field generating members can be adopted for generating the subsidiary magnetic fields. Also, three or more pairs of the subsidiary magnetic field generating members can be employed for generating the subsidiary magnetic fields as required. One or two pairs of the subsidiary magnetic field generating members may be used to generate the subsidiary magnetic fields symmetrically with respect to the main magnetic field.

A secondary electric field is generated between the main and subsidiary magnetic fields 23 and 25 in a Z-axis direction. A gas flows between the main and the subsidiary magnetic fields 23 and 25, and then flows toward the secondary electric field in the Z-axis direction.

Figure 3:
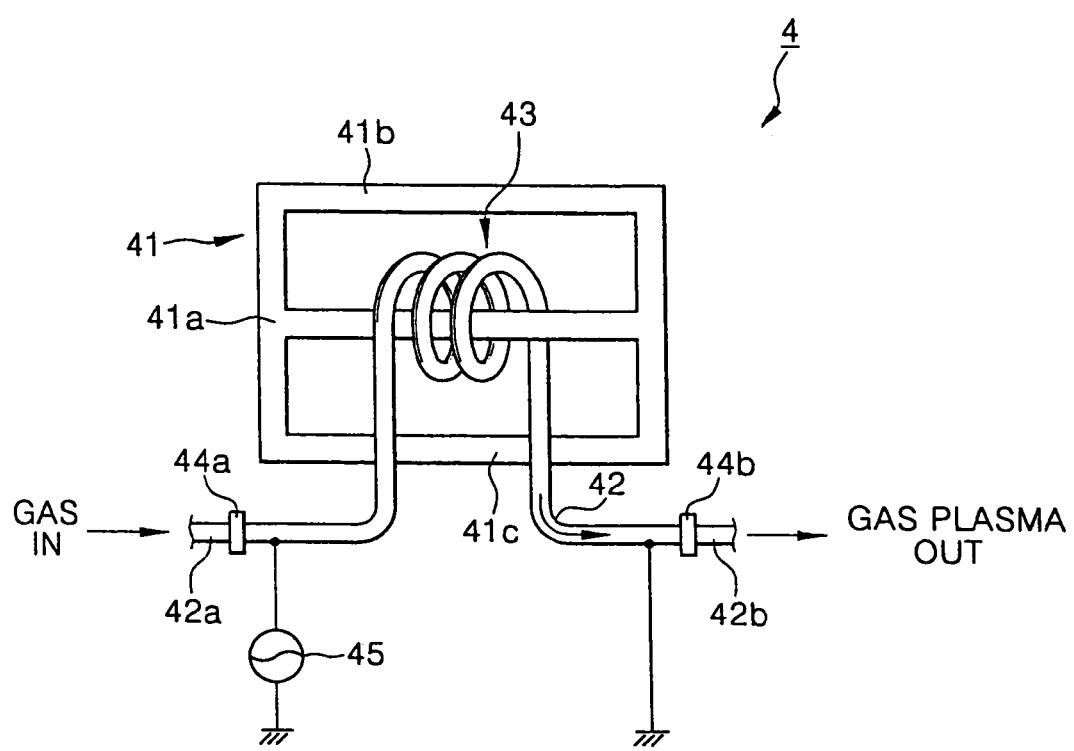
FIG. 3 is a schematic view illustrating an apparatus for generating a plasma according to another exemplary embodiment of the present invention.

FIG. 3 is a schematic view illustrating an apparatus for generating a plasma according to another exemplary embodiment of the present invention.

Referring to FIG. 3, a plasma generating apparatus 4 has a magnetic field generating element 41. The magnetic field generating element 41 includes a main magnetic field generating member 41a and a pair of subsidiary magnetic field generating members 41b and 41c. The main magnetic field generating member 41a generates a main magnetic field formed along the axis of the magnetic field generating element 41, and the subsidiary magnetic field generating members 41b and 41c generate subsidiary magnetic fields parallel to or substantially parallel to the main magnetic field.

The magnetic field generating element 41 includes permanent magnetic material such as ferrite. In addition, the magnetic field generating element 41 can include an electromagnet. The main and subsidiary magnetic fields may also be generated using the permanent magnetic material such as ferrite. Ferrite generally has a high magnetic permeability in the frequency range of approximately several tens to 500 KHz. A power source 45 provides the sine wave current having the low frequency of approximately 350 KHz to 13.56 MHz with the high power of approximately 1.5 to 10 KW. In an exemplary embodiment, the power source 45 supplies the sine wave current of approximately 400 KHz with the power of approximately 6 to 8 KW in order to advantageously decompose a carbon fluoride gas such as $C_3F_8$.

The plasma generation apparatus 4 also includes a plasma generating and gas flowing member 43, and the power source 45. The plasma generating and gas flowing member 43 has a coil shape to enclose the main magnetic field generating member 41a. High power current is applied from the power source 45 to the plasma generating and gas flowing member 43. As shown in FIGL 3, the plasma generating and gas flowing member 43 passes through the region having high magnetic flux density between the main and subsidiary magnetic field generating members 41a, 41b, and 41c. The pressure of the plasma generating and gas flowing member 43 is approximately 500 mTorr to 8 Torr, in an exemplary embodiment the pressure is 1 to 2 Torr.

In an exemplary embodiment, the gas can be advantageously decomposed under the low pressure of the plasma generating and gas flowing member 43 because the power source 45 is a high power source, and the plasma caused from the gas has a high density in accordance with the shape of the plasma generating and gas flowing member 43.

In the plasma generating apparatus 4 in FIG. 3, the high power current is directly applied to the plasma generating and gas flowing member 43, so that the electric field is generated in the plasma generating and gas flowing member 43. Thus, the plasma generating apparatus 4 is different from the conventional plasma generating apparatus 1 wherein the electric field generated in the tube 11 is induced by the magnetic field generating member 13 as shown in FIG. 1.

Exemplary embodiments of the present invention adopt the principle of a single winding transformer instead of a double winding transformer to construct the plasma generating apparatus 4 because the efficiency of the double winding transformer is lower than that of the single winding transformer by approximately 30 to 50 percent. Hence, the plasma generating apparatus 4 of exemplary embodiments of the present invention has improved efficiency.

Figure 4:
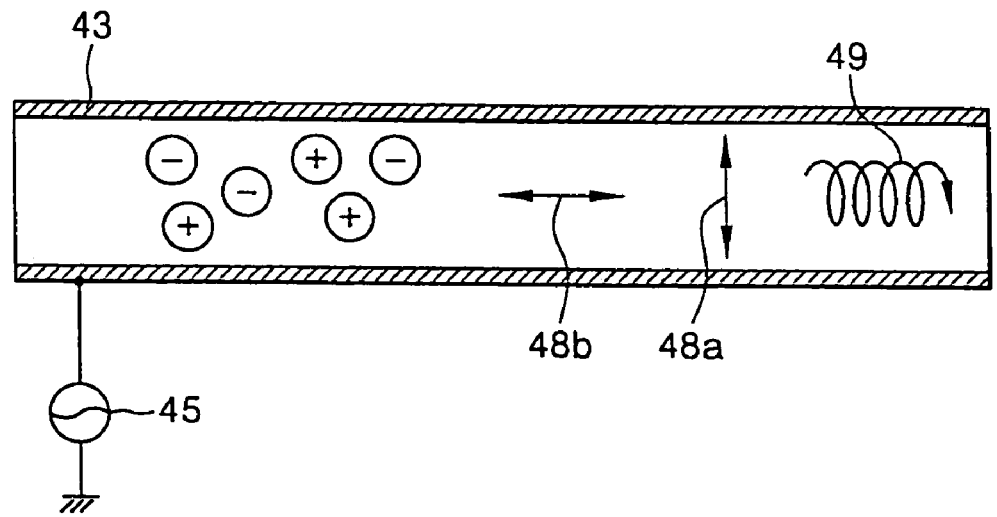
FIG. 4 is a schematic cross-sectional view illustrating generation of the plasma in a plasma-generating member according to another exemplary embodiment of the present invention.

FIG. 4 is a schematic cross-sectional view illustrating generation of the plasma in a plasma-generating member according to another exemplary embodiment of the present invention. Referring to FIG. 4, a primary electric field 48a is generated in the plasma generating and gas flowing member 43 by the high power current provided by the power source 45. Also, the secondary electric field 48b is generated in the plasma generating and gas flowing member 43 by the main and subsidiary magnetic field generating members 41a, 41b and 41c respectively described in FIG. 3. In the plasma generating and gas flowing member 43, the primary electric field 48a is substantially perpendicular to the second electric field 48b.

A radical atmosphere is generated in the plasma generating and gas flowing member 43 by the primary and secondary electric fields 48a and 48b, which are perpendicular or substantially perpendicular to each other, causing the particles to have spiral acceleration 49 as shown in FIG. 4.

Figure 5:
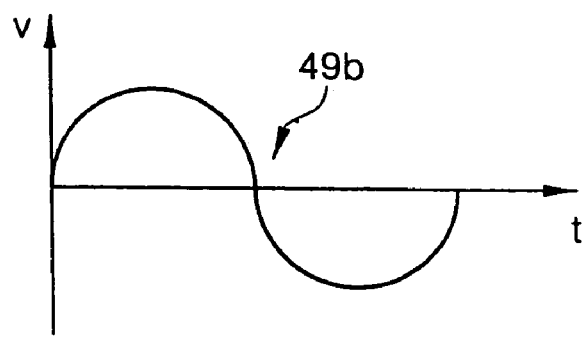
FIG. 5 is a graph showing the motion of particles in the plasma-generating member according to another exemplary embodiment of the present invention.

FIG. 5 includes a curve 49b showing the motion of particles in the plasma-generating member according to an exemplary embodiment of the present invention. In FIG. 5, a vertical axis indicates the velocity V of the particles, and a horizontal axis represents time. Referring to FIG. 5, the particles are accelerated by the primary and the secondary electric fields 48a and 48b, and then spirally advance along the moving direction of the gas.

Referring to FIG. 3, the plasma generating and gas flowing member 43 includes a conductive pipe 42 in the region between the main and subsidiary magnetic field generating members 41a, 41b and 41c, to transform the gas passing there-through into a plasma phase (or state) due to the applied electric fields 48a and 48b described in FIG. 4.

The conductive pipe 42 includes conductive metal such as aluminum or aluminum alloy. When the high power current is applied to both ends of the conductive pipe 42, the high power current passes through the region between the main and subsidiary magnetic field generating members 41a, 41b and 41c, and through the region having high magnetic flux density between the main and subsidiary magnetic field generating members 41a, 41b and 41c. The high power current passing through the region having high magnetic flux density substantially flows perpendicular or substantially perpendicular to the positive magnetic field, formed by the main and subsidiary magnetic field generating members 41a, 41b and 41c. Hence, the electric field is generated in the plasma generating and gas flowing member 43, and the gas flowing therein is ionized to thereby form the plasma. As shown in FIG. 3, the conductive pipe 42 has a coil shape to enclose the main magnetic field generating member 41a, such that the gas fluidizing in the conductive pipe 42 has a coil shaped flow path. The current passing through the conductive pipe 42, and the gas flowing in the conductive pipe 42 flow in the same or substantially the same direction. Because the current is applied as a sine wave high frequency alternating current, the current is applied in a forward and reverse direction with respect to the direction of gas flow.

A gas supply pipe 42a is connected to one end of the conductive pipe 42, where the gas is provided from a gas source (not shown) outside the region of the magnetic fields. The gas is supplied from the gas supply pipe 42a to the conductive pipe 42. Also, a plasma exhausting pipe 42b is connected to the other end of the conductive pipe 42 to exhaust plasma. The plasma is formed in the conductive pipe 42 and in an exemplary embodiment, provided by the plasma exhausting pipe 42b to the semiconductor device, outside the magnetic field region (not shown).

One pipe connecting member 44a connects the gas supply pipe 42a to the conductive pipe 42, and another pipe connecting member 44b connects the plasma exhausting pipe 42b to the conductive pipe 42. The pipe connecting members 44a and 44b include insulation material (e.g., plastic or insulation ceramic). Thus, the current flowing through the conductive pipe 42 is deterred from leaking from the gas supply pipe 42a and the plasma exhausting pipe 42b.

Figure 6:
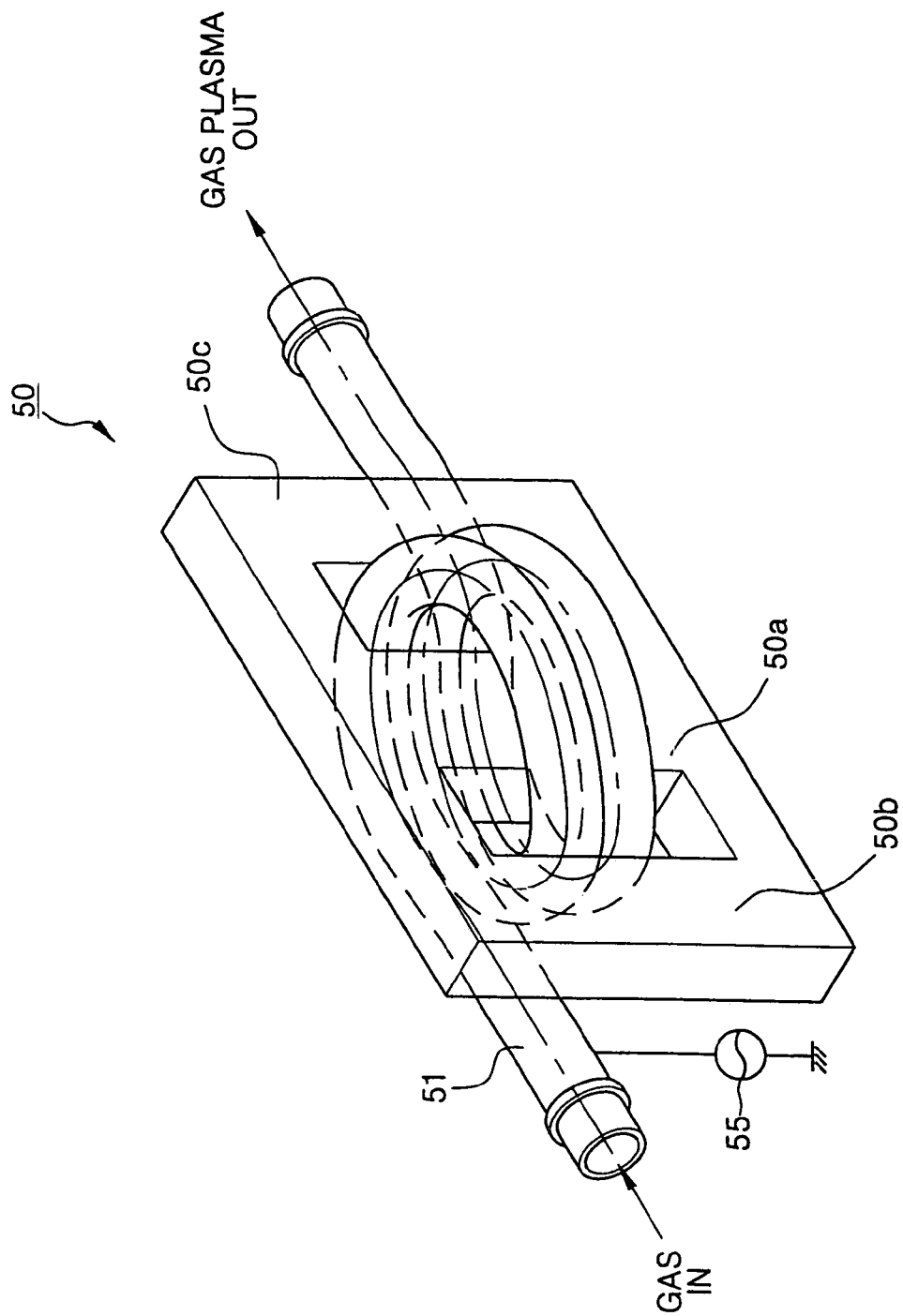
FIG. 6 is a perspective view illustrating the apparatus for generating a plasma according to another exemplary embodiment of the present invention.

FIG. 6 is a perspective view illustrating the apparatus for generating a plasma according to another exemplary embodiment of the present invention.

Referring to FIG. 6, a main magnetic field generating member 50a is positioned at the center of a plasma generating apparatus 50. The main magnetic field generating member 50a is disposed along the axis of the plasma generating apparatus 50. A pair of subsidiary magnetic field generating members 50b and 50c are substantially symmetrically positioned with respect to the main magnetic field generating member 50a. The subsidiary magnetic field generating members 50b and 50c are disposed in parallel or substantially parallel to the axis of the main magnetic field generating member 50a. Because the subsidiary magnetic field generating members 50b and 50c are substantially symmetrically disposed in parallel or substantially parallel to the main magnetic field generating member 50a, the magnetic flux of the magnetic field adjacent to the main magnetic field generating member 50a can be enhanced.

A plasma generating and gas flowing member 51 is disposed to enclose the main magnetic field generating member 50a as a spiral flow path, positioning the plasma generating and gas flowing member 51 in the magnetic fields generated by the main and subsidiary magnetic field generating members 50a, 50b and 50c.

The main and the subsidiary magnetic field generating members 50a, 50b and 50c generate static magnetic fields, namely, the main magnetic field is formed along the axis of the main magnetic field generating member 50a, and the subsidiary magnetic field generating members 50b and 50c generate a pair of subsidiary magnetic fields in parallel to the axis of the main magnetic field generating member 50a.

A power source 55 is connected to one end portion of the plasma generating and gas flowing member 51 for applying high power current. The high power current is directly applied to the plasma generating and gas flowing member 51, so an electric field is directly generated in the plasma generating and gas flowing member 51.

Figure 7:
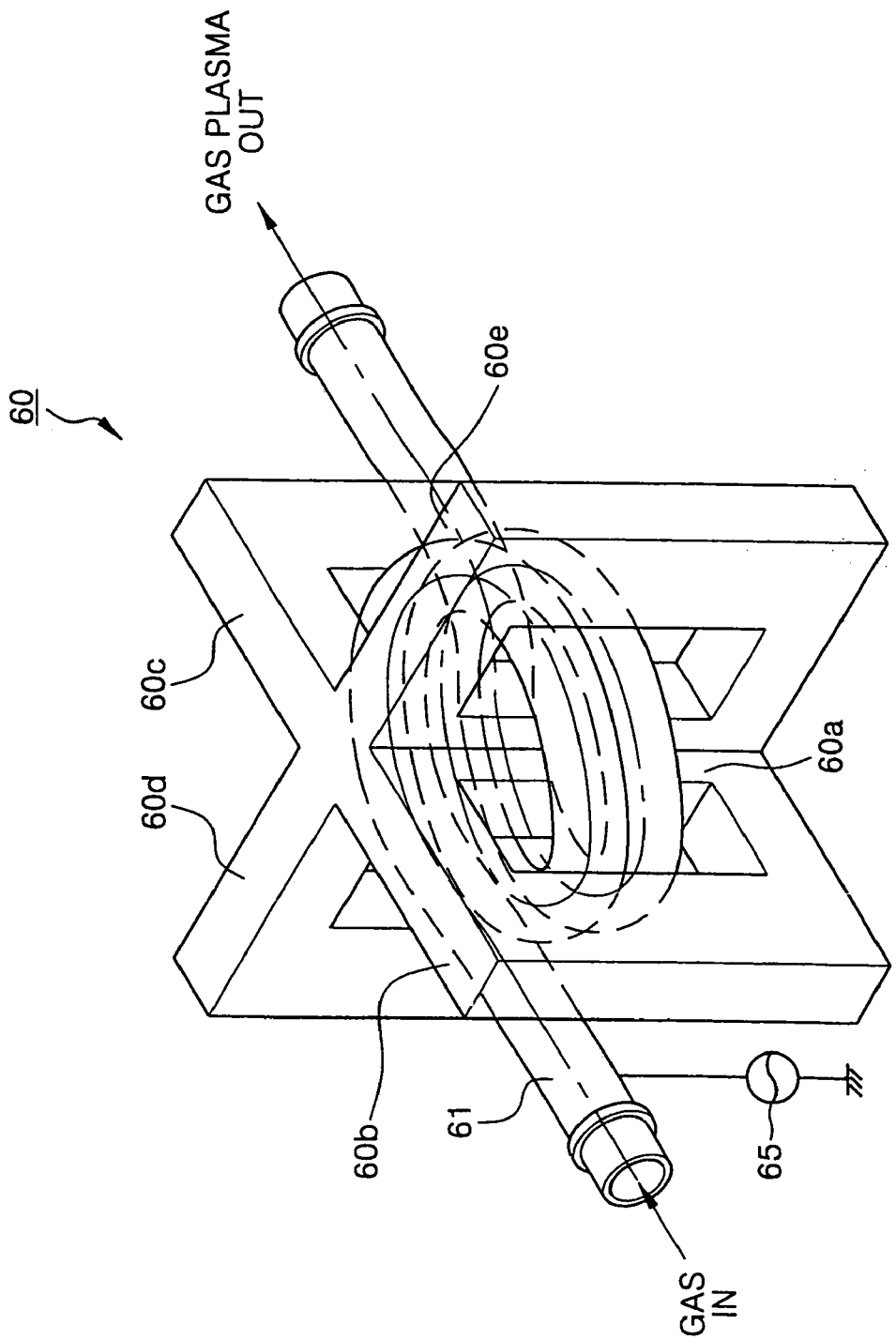
FIG. 7 is a perspective view illustrating an apparatus for generating a plasma according to another exemplary embodiment of the present invention.

FIG. 7 is a perspective view illustrating an apparatus for generating a plasma according to another exemplary embodiment of the present invention.

Referring to FIG. 7, a main magnetic field generating member 60a is disposed along the axis of a plasma generating apparatus 60. Subsidiary magnetic field generating members 60b, 60c, 60d and 60e are substantially symmetrically disposed, with respect to the main magnetic field generating member 60a. Thus, the subsidiary magnetic field generating members 60b, 60c, 60d and 60e are positioned approximately 90° from the center on the main magnetic field generating member 60a. Additionally, the subsidiary magnetic field generating members 60b, 60c, 60d and 60e are positioned in parallel or substantially parallel to the axis of the main magnetic field generating member 60a.

A plasma generating and gas flowing member 61 is disposed to enclose the main magnetic field generating member 60a as a spiral flow path. The plasma generating and gas flowing member 61 is disposed to pass through the region having a high magnetic flux density between the main and subsidiary magnetic field generating members 60a, 60b, 60c, 60d and 60e. When a gas plasma is formed, the main magnetic field generating member 60a generates the main magnetic field formed along the axis of the main magnetic field generating member 60a, and the subsidiary magnetic field generating members 60b, 60c, 60d, and 60e generate subsidiary magnetic fields in parallel or substantially parallel to the axis of the main magnetic field generating member 60a, respectively.

As shown in FIGS. 6 and 7, the subsidiary magnetic field generating members are in parallel or substantially parallel to the main magnetic field generating member. The number of the subsidiary magnetic field generating members can be determined as a function of the magnetic flux density between the main and subsidiary magnetic field generating members.

In the plasma generating apparatuses in FIGS. 6 and 7, a gas flows along the path identical to or substantially identical to that of the high frequency current provided from the power source. Particularly, the gas flows in the pipe which the high power current is applied so that the gas passes along the path corresponding to the applied high frequency current. The gas is ionized by colliding with free electrons accelerated through the electric field, generated by the high power current.

The magnetic flux density is close along the axis of the main magnetic field generating member due to the main and subsidiary magnetic field generating members. Thus, most of the gas plasma moves along the axis of the main magnetic field generating member. In addition, the efficiency of the generation of the plasma can be enhanced due to the electric field directly generated from the high power current by utilizing the principle of the single winding transformer. Finally, the time for generating the plasma can be shortened to within approximately 3 seconds using exemplary embodiments of the present invention.

Figure 8:
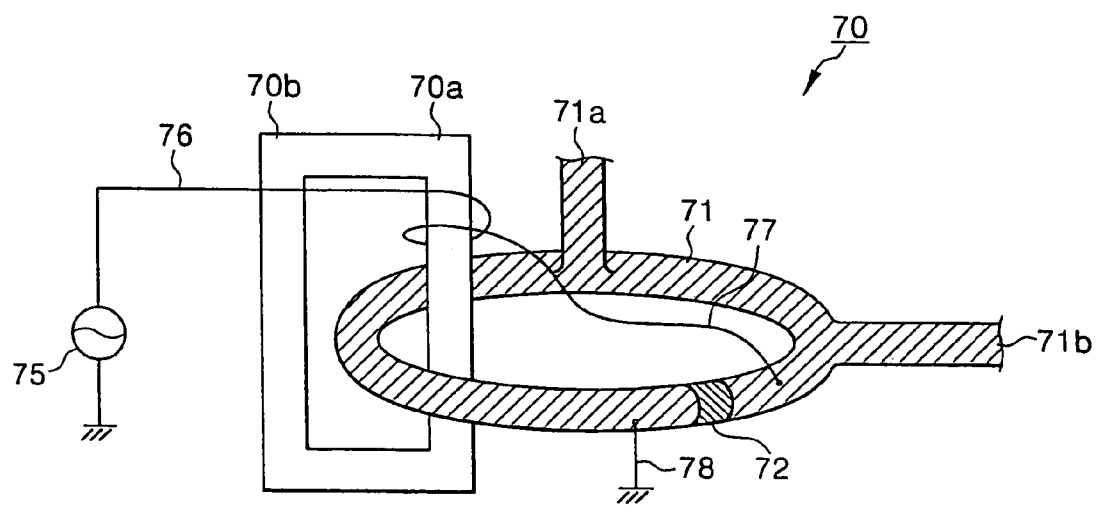
FIG. 8 is a schematic perspective view illustrating an apparatus for generating a plasma according to another exemplary embodiment of the present invention.

FIG. 8 is a schematic perspective view illustrating an apparatus for generating a plasma according to another exemplary embodiment of the present invention.

Referring to FIG. 8, a main magnetic field generating member 70a is disposed along the axis of a plasma generating apparatus 70, and a subsidiary magnetic field generating member 70b is disposed to be in parallel or substantially parallel to the axis of the main magnetic field generating member 70a. In an exemplary embodiment of the present invention, an electromagnet, in which a coil is wound around a permanent magnet, is employed, namely, the main and the subsidiary magnetic field generating members 70a and 70b include iron cores used as the passages for the lines of magnetic force. A coil 76 is disposed to enclose the main magnetic field generating member 70a. A radio frequency (RF) generator 75 is connected to the coil 76 to apply high power and low frequency alternating current to the coil 76. An electromagnetic field is generated in parallel or substantially parallel to the main magnetic field generating member 70a, and an induction magnetic field is generated by the subsidiary magnetic field generating member 70b.

A plasma generating and gas flowing member 71 includes a conductive pipe, and encloses the main magnetic field generating member 70a. In addition, the plasma generating and gas flowing member 71 has a partially opened ring shape passing through an area between the main and the subsidiary magnetic field generating members 70a and 70b, including through the region having a high magnetic flux density.

As shown in FIG. 8, the plasma generating and gas flowing member 71 has the partially open ring shape. A pipe connecting member 72, similar to the pipe connecting members 44a and 44b in FIG. 3, is positioned between both ends of the partially open ring. The pipe connecting member 72 includes insulation material (e.g., plastic or insulation ceramic). Thus, the current can flow clockwise or counterclockwise along the plasma generating and gas flowing member 71. The current is provided in parallel or substantially parallel to the flow direction of the gas in a forward or reverse direction with respect to the direction of the gas flow. Thus, the current generates an electric field in order to transform the flowing gas into plasma.

One end of the plasma generating and gas flowing member 71, having the open ring shape, is connected to the coil 76 enclosing the main magnetic field generating member 70a through a first electric wire 77. Another end of the plasma generating and gas flowing member 71 is grounded through a second electric wiring 78. A gas inlet 71a is formed at the upper portion of the plasma generating and gas flowing member 71 and a gas outlet 71b is extended from the lateral portion of the plasma generating and gas flowing member 71.

In the plasma generating apparatus 70 of an exemplary embodiment, the high power current of a power source 75 is primarily applied to the main magnetic field generating member 70a, to form the main and the subsidiary magnetic fields. The high frequency alternating current is also applied to the plasma generating and gas flowing member 71, thereby generating the electric field in the plasma generating and gas flowing member 71.

Thus, the gas for generating the plasma is injected through the gas inlet 71a. The gas is transformed into the plasma state by the magnetic fields, the secondary electric field generated from the main and the subsidiary magnetic field generating members 70a and 70b, and by the primary electric field generated from the plasma generating and gas flowing member 71.

As for the exemplary embodiment shown in FIG. 7, the gas flows in parallel or substantially parallel to the applied path of the high power current, and the gas is ionized to generate the plasma. As discussed herein, the gas collides with free electrons, generated by the high power current, accelerated in the electric field to ionize the gas.

Exemplary Method and Apparatus for Manufacturing a Semiconductor Device

Hereinafter, exemplary methods for manufacturing a semiconductor device by employing the plasma generated through the above-described remote method will be explained.

Referring to FIGS. 3, 6 and 7, the main magnetic field is generated along the axis of the main magnetic field generating member, and the subsidiary magnetic fields are formed in parallel or substantially parallel to the axis. The conductive pipe is disposed to spirally enclose the axis. When the high frequency current is applied to the conductive pipe, the high power current is provided along the path between the main and subsidiary magnetic fields. The induction magnetic and the induction electric fields are generated by the high power current.

The gas flows through the conductive pipe, including through the region between the main and subsidiary magnetic fields. The gas plasma is generated from the gas by the induction magnetic and induction electric fields. In an exemplary embodiment, the gas includes fluorine atoms. Examples of the gas include $NF_3$ gas or $C_xF_y$ gas (wherein x>0 and y>0). Additionally, the $C_xF_y$ gas can include $CF_4$, $C_3F_6$ or $C_3F_8$, in an exemplary embodiment the $C_xF_y$ gas is $C_3F_8$.

The plasma is provided into the chamber wherein the process for manufacturing the semiconductor device is executed. The chamber is separate from the plasma generating apparatus. Thus, the gas plasma is provided into the chamber through the plasma exhausting pipe disposed at the end portion of the conductive pipe (as shown in FIGS. 3, 5 and 7).

By using the plasma provided into the chamber for the method of manufacturing the semiconductor device, an etching process, a film deposition process, or a cleaning process can be performed in the chamber. However, other processes for manufacturing the semiconductor device can be executed in the chamber using the plasma.

When the gas plasma is generated by the above-described exemplary methods, and employed for manufacturing the semiconductor device, the productivity of the semiconductor manufacturing process can be improved. The manufacturing cost of the semiconductor device can also be reduced because the plasma can be formed using a low-priced $C_xF_y$ gas (e.g., $C_3F_8$).

When the plasma is generated using an $NF_3$ gas, a carrier gas (e.g., argon gas) is used to transfer the plasma for operating the chamber with a low power. Argon gas must be produced in the same quantity as that of the $NF_3$ gas. However, according to the exemplary embodiment of the present invention, the high efficiency of the generation of the plasma can be achieved when the argon gas is added in a quantity approximately one-third the $NF_3$ gas. Hence, the efficiency of the manufacturing processes can be improved and the ignition time of the plasma can be shortened.

Hereinafter, exemplary methods for manufacturing a semiconductor device will be further described with further reference to the accompanying drawings.

Figure 9:
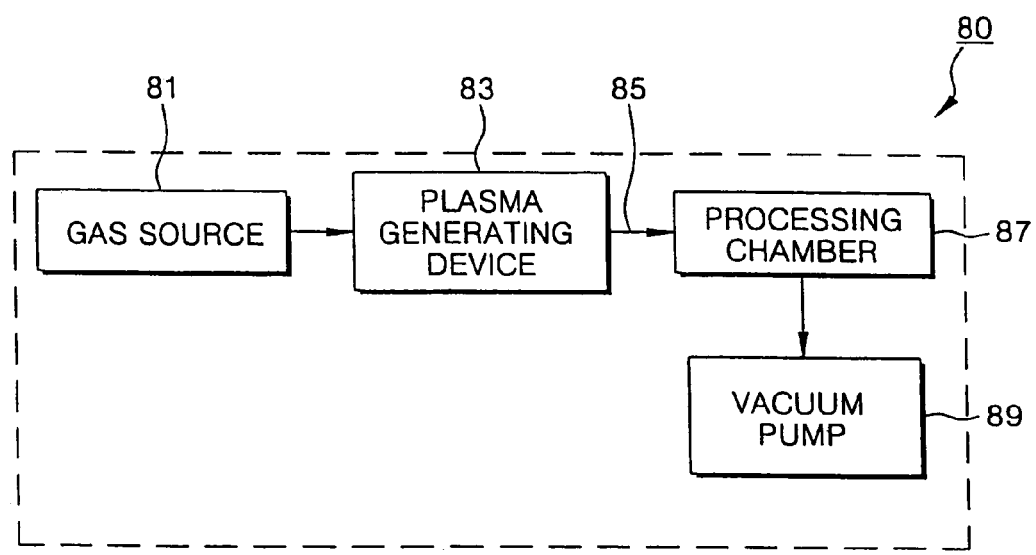
FIG. 9 is a block diagram illustrating an apparatus for manufacturing a semiconductor device according to another exemplary embodiment of the present invention.

FIG. 9 is a block diagram illustrating a method for manufacturing a semiconductor device according to an exemplary embodiment of the present invention.

Referring to FIG. 9, an apparatus 80 for manufacturing a semiconductor device has a gas source 81 for providing a gas. In an exemplary embodiment, the gas includes fluorine atoms, for example, $NF_3$ gas or $C_xF_y$ (wherein x>0 and y>0). The gas can be pertinently selected in accordance with the process used for manufacturing the semiconductor device.

The plasma generating device 83 shown in FIGS. 3, 6 and 7 is connected to the gas source 81. The gas source 81 is connected to the plasma generating member 83 through the gas supply pipe (e.g., reference FIG. 3).

The plasma generating device 83 includes the main magnetic field generating member for primarily generating the main magnetic field along the axis of the main magnetic field generating member. Additionally, the plasma generating device 83 has at least one subsidiary magnetic field generating member for generating the subsidiary magnetic field in parallel to the axis, so the magnetic flux density of the main magnetic field can increase along the axis. The plasma generating device 83 further has the conductive pipe including the conductive material. The conductive pipe passes through the main magnetic field formed along the axis.

The gas supplied through the gas supply pipe passes through the conductive pipe. When the high power current is applied to the conductive pipe, the gas is transformed into the plasma 85. Thus, the plasma generating device 83 operates as described herein with reference to the various embodiments and their various methods of transforming the gas into the plasma 85.

The plasma 85, generated from the gas (hereinafter, frequently referred as the gas plasma), is provided into a processing chamber 87. The processing chamber 87 is utilized as the etching chamber for etching the films formed on a substrate, or a deposition chamber for forming films on the substrate.

A vacuum pump 89 can be connected to the processing chamber 87 in order to create a vacuum in the processing chamber 87 when the processes for forming the semiconductor device is executed. The vacuum pump 89 can also exhaust the remaining reaction by-product in the processing chamber 87.

The plasma generating device 83 is connected to the processing chamber 87 through the plasma exhausting pipe as shown in FIG. 3. As described above, the plasma is provided into the processing chamber 87 by a remote method.

Figure 10:
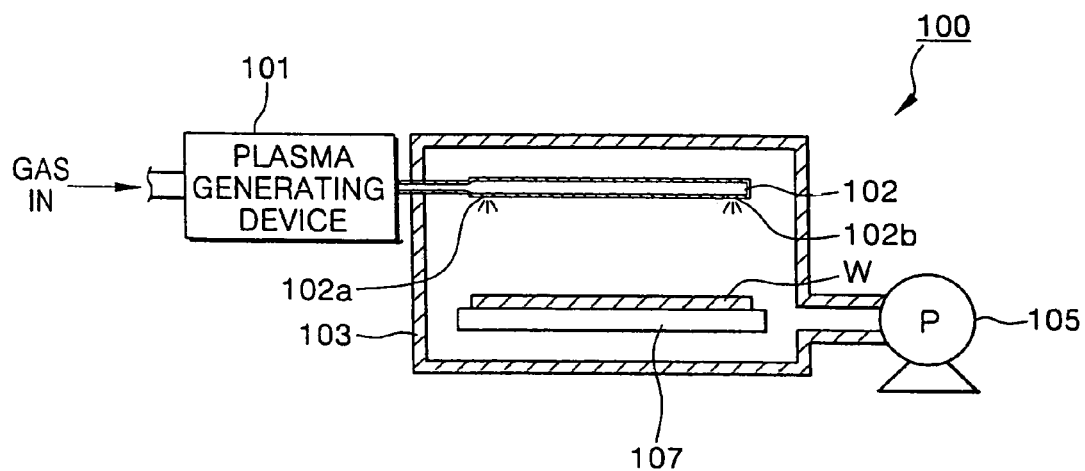
FIG. 10 is a schematic cross-sectional view illustrating an etching apparatus according to another exemplary embodiment of the present invention.

FIG. 10 is a schematic cross-sectional view illustrating an etching apparatus according to an exemplary embodiment of the present invention.

Referring to FIG. 10, an etching apparatus 100 has a remote type plasma generating device 101. Exemplary embodiments of the plasma generating device 101 are shown in FIGS. 3, 6 and 7. The etching apparatus 100 further includes an etching chamber 103 and a vacuum pump 105 for creating a vacuum in the etching chamber 103.

A gas including fluorine, such as $NF_3$ gas or $C_xF_y$ gas (wherein, x>0 and y>0) is provided into the plasma generating device 101. The pressure of the gas is approximately 500 mTorr to 8 Torr. In an exemplary embodiment, the gas has a relatively low pressure of approximately 1 to 2 Torr. The plasma generating device 101 generates the plasma including fluorine (F) radicals by ionizing the gas. The sine wave alternating current having the frequency of approximately 350 KHz to 13.56 MHz, is applied to the plasma generating device 101 with the power of approximately 1.5 to 10 KW. In an exemplary embodiment, the sine wave alternating current, having the relatively low frequency of approximately 400 KHz, is applied to the plasma generating device with the power of approximately 6 to 8 KW. Thus, the free electrons existing in the gas flow portion of the plasma generating device 101 are effectively accelerated. The accelerated free electrons collide with the gas in the gas flow portion of the plasma generating device 101, so that the gas is changed into plasma. As a result, the plasma which includes the fluorine radicals is generated. The magnetic field generating members of the plasma generating device 101 efficiently controls the motion of the plasma.

The plasma including the fluorine radicals is provided into the etching chamber 103. A shower head 102 is installed in the etching chamber 103 for spraying the gas plasma. A plurality of spray holes 102a and 102b are formed through the shower head 102. To uniformly spray the plasma, the spray holes 102a and 102b in an exemplary embodiment are positioned at the entrance and the exit of the etching chamber 103, respectively.

Figure 11:
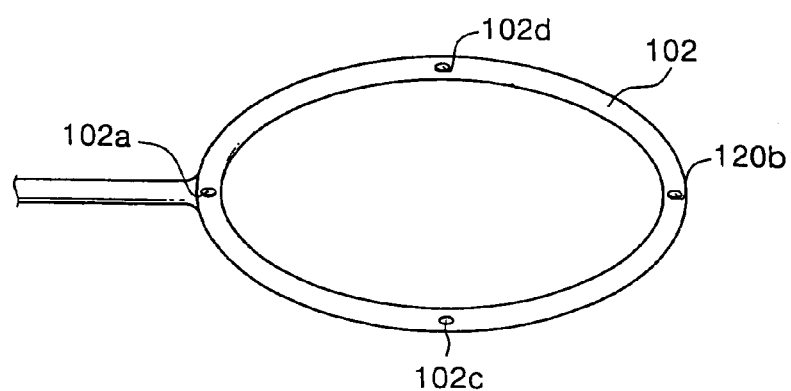
FIG. 11 is a schematic perspective view showing another exemplary embodiment of the showerhead of FIG. 10.

FIG. 11 is a schematic perspective view of an exemplary embodiment, showing the shower head in FIG. 10.

Referring to FIG. 11, the shower head 102 includes four spray holes 102a, 102b, 102c an 102d disposed at intervals. Utilizing the spray holes 102a, 102b, 102c and 102d, the gas plasma can be uniformly applied onto the edge portion of a wafer to be etched while the etching efficiency of the gas plasma can be improved by a side flow method.

Though four spray holes 102a, 102b, 102c and 102d are formed through the shower head 102 in FIG. 11, one skilled in the art would understand the number of the spray holes can be varied as required. Thus, two spray holes can be formed adjacent to the entrance and the exit of the etching chamber, or more than four spray holes can be disposed through the shower head.

Referring to FIG. 10, when the gas plasma is introduced into the etching chamber 103, the fluorine radicals of the gas plasma react with the material formed on a substrate W, disposed on a chuck 107. Accordingly, film (layers) are formed on the substrate W, and portions of the film (layers) are exposed through a pattern mask. The gas plasma reacts with the exposed film (layers) so that the film (layers) are etched.

After an etching process is performed, the etching chamber 103 is cleaned.

The substrate W, having been treated by the etching process, is unloaded from the etching chamber 103. Then, a gas, for example, a $C_3F_8$ gas is provided to the plasma generating device 101. The plasma generating device 101 ionizes the $C_3F_8$ gas to generate the plasma including fluorine radicals. The high power current, having the low frequency of approximately 400 KHz is applied to the plasma generating device 101 with the power of approximately 2,000 W, such that the free electrons existing in the plasma generating portion are effectively accelerated. Hence, the free electrons collide with the $C_3F_8$ gas flowing in the plasma generating part to generate the plasma. The gas is changed into plasma that includes fluorine radicals.

The plasma including the fluorine radicals is provided into the etching chamber 103. The fluorine radicals react with the reaction by-products, such as polymers adhered to the inner wall of the etching chamber 103, to remove the reaction by-products from the wall of the etching chamber 103. The reaction by-products are exhausted from the etching chamber 103 by using the vacuum pump 105, thereby cleaning the etching chamber 103.

The apparatus for manufacturing the semiconductor device, which includes the plasma generating device, can be employed in accordance with the selected gas and the construction of the processing chamber.

Hereinafter, a novel gas composition for generating a plasma according to an exemplary embodiment of the present invention will be described.

The gas composition for generating the plasma of an exemplary embodiment includes $C_3F_8$ gas as an ingredient. The $C_3F_8$ gas is ionized and excited by the above-described remote plasma generating device, so that fluorine free radicals, excited radicals, anions, and cations are generated from the $C_3F_8$ gas. The fluorine free radicals and the excited radicals, anions, and cations move into the processing chamber and react chemically with the residual substances (in general, silicon residues like silicon oxide and silicon oxy-nitride) attached to the inner wall of the chamber, such that they are exhausted to the outside as gas phased by-products.

The gas composition of the generated plasma may includes oxygen gas. When the $C_3F_8$ gas is employed for only manufacturing the semiconductor device, carbon compounds are generated as processing by-products. The carbon compounds may attach to the insides of pipes or a manufacturing device, so the carbon compounds should be removed as carbon dioxides by utilizing their reaction with oxygen gas.

The $C_3F_8$ gas and the oxygen gas can remove silicon oxy-nitride, according to the following reaction equation:

$$C_3F_8 + 3O_2 + 2SiON = 2SiF_4 + 3CO_2 + N_2$$

Though the above reaction equation can be varied in accordance with the material to be etched or removed, the adequate flow rate of the oxygen gas can be generally determined, considering the above reaction equation.

When the flow rate of the oxygen gas is less than double the flow rate of the $C_3F_8$ gas, the residues of the carbon compounds may disadvantageously exist in the chamber because the carbon cannot be sufficiently changed into carbon dioxide and the carbon may not be removed. On the other hand, the generation of the fluorine radicals may be disadvantageously reduced in the plasma generating device when the flow rate of the oxygen gas exceeds five times the flow rate of the $C_3F_8$ gas. Therefore, the flow rate of the oxygen gas is approximately twice to five times larger than the $C_3F_8$ gas. In an exemplary embodiment, the flow rate of the oxygen gas is approximately 2.5 times to four times larger than the $C_3F_8$ gas. Another exemplary embodiment employs the flow rate of the oxygen gas at approximately three times larger than that of the $C_3F_8$ gas.

The gas composition for generating a plasma of an exemplary embodiment of the present invention includes an inert gas such as argon gas, as a carrier gas, in order to provide the $C_3F_8$ gas and the oxygen gas into the chamber. In this case, to achieve the transportation of the $C_3F_8$ gas and the oxygen gas, the argon gas in an exemplary embodiment has a flow rate approximately three times to fifteen times larger than the $C_3F_8$ gas.

For example, the flow rate of the $C_3F_8$ gas is approximately 400 to 800 sccm, in another exemplary embodiment approximately 600 to 700 sccm while the flow rate of the argon gas is approximately 1,000 to 6,000 sccm, and still another exemplary embodiment approximately 2,000 to 4,000 sccm. Also, the flow rate of the oxygen gas is approximately 1,000 to 3,600 sccm, and in an exemplary embodiment approximately 1,400 to 2,100 sccm. However, other gases can be employed in accordance with the above-mentioned conditions.

Generation of an Exemplary Plasma by Employing a Gas Composition for Generating the Plasma

EXAMPLE 1

In an exemplary embodiment, a processing gas including $C_3F_8$ gas at a flow rate of approximately 400 sccm, oxygen gas at a flow rate of approximately 1,000 sccm, and argon gas at a flow rate of approximately 2,000 sccm, was introduced into the remote plasma generating device shown in FIG. 6. Then, a plasma was generated from the processing gas in the plasma generating device under a pressure of approximately 0.7 Torr with a power of approximately 5,600 Watts.

EXAMPLE 2

In yet another exemplary embodiment, after a processing gas including $C_3F_8$ gas, is introduced at a flow rate of approximately 600 sccm, oxygen gas is introduced at a flow rate of approximately 1,800 sccm, and argon gas is introduced at a flow rate of approximately 4,000 sccm, into the remote plasma generating device shown in FIG. 6. A plasma was generated from the processing gas in the plasma generating device under a pressure of approximately 1.1 Torr with a power of approximately 6,400 Watts.

EXAMPLE 3

In another exemplary embodiment, a plasma was generated in the same manner as in Example 2 except that the pressure was approximately 1.5 Torr.

EXAMPLE 4

In another exemplary embodiment, a plasma was generated in the same manner as in Example 2 except that the flow rate of argon gas was approximately 6,000 sccm, the pressure was approximately 3.5 Torr, and the power was approximately 6,100 Watts.

EXAMPLE 5

In another exemplary embodiment, a plasma was generated in the same manner as in Example 2 except that the flow rate of argon gas was approximately 6,000 sccm, the pressure was approximately 6.5 Torr, and the power was approximately 6,700 Watts.

COMPARATIVE EXAMPLE

In an exemplary embodiment, a processing gas including $NF_3$ gas at a flow rate of approximately 1,100 sccm, and argon gas at a flow rate of approximately 2,000 sccm, was introduced into the remote plasma generating device manufactured by ASTEX Company as shown in FIG. 1. Then, a plasma was generated from the processing gas in the plasma generating device under a pressure of approximately 0.8 Torr with the power of approximately 3,000 Watts.

Measurement of an Etching Rate

In an exemplary embodiment, a silicon oxy-nitride (SiON) film having the thickness of approximately 6,000 Å was formed on a substrate (a bare wafer) by a plasma enhanced chemical vapor deposition process. The etching rate of the silicon oxy-nitride film was measured after the silicon oxy-nitride film was etched using the gas plasmas generated in accordance with the Examples 1 to 5, and the Comparative Example in the etching apparatus shown in FIG. 9. The measured etching rates are shown in the Table 1.

TABLE 1

|  | Etching rate (Å/min) | Estimation |
| --- | --- | --- |
| Example 1 | 4,408 | good |
| Example 2 | 5,077 | excellent |
| Example 3 | 4,801 | good |
| Example 4 | 4,400 | good |
| Example 5 | 4,229 | good |
| Comparative Example | 4,094 | normal |

As shown in Table 1, Examples 1 to 5 employing the remote plasma generating device in accordance with exemplary embodiments of the present invention show relatively excellent etching rates in comparison to that of the Comparative Example employing the conventional plasma device. Particularly, a more desirable etching rate is achieved when the pressure is approximately 1 Torr, and the oxygen gas has a flow rate approximately three times larger than that of the $C_3F_8$ gas.

Cleaning Test

In an exemplary embodiment, an etching apparatus was cleaned using the gas plasmas generated in accordance with Example 2 and the Comparative Example. The cleaning time was determined with the silicon oxy-nitride film having the thickness of approximately 600 Å, deposited by a plasma enhanced chemical vapor deposition process. The cleaning results concerning reaction by-products were measured with an RGA quardrupole mass spectrometer (QMS; wherein generated SiF4 is ionized to be quantitatively measured) in accordance with predetermined periods of time.

Figure 12:
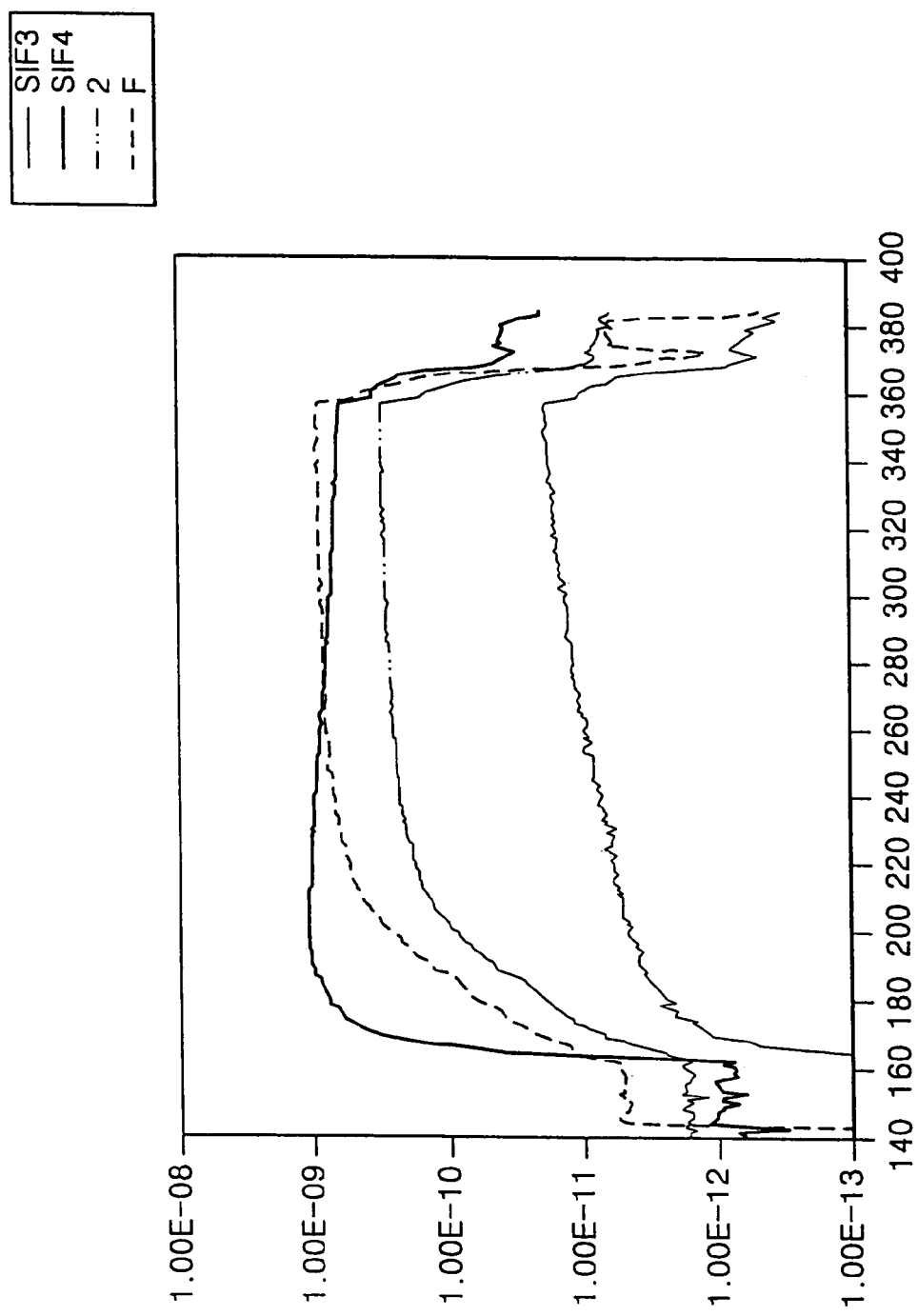
FIG. 12 is a graph showing the measured results of the reaction by-products by employing the gas plasma in accordance with Comparative Example 1.
Figure 13:
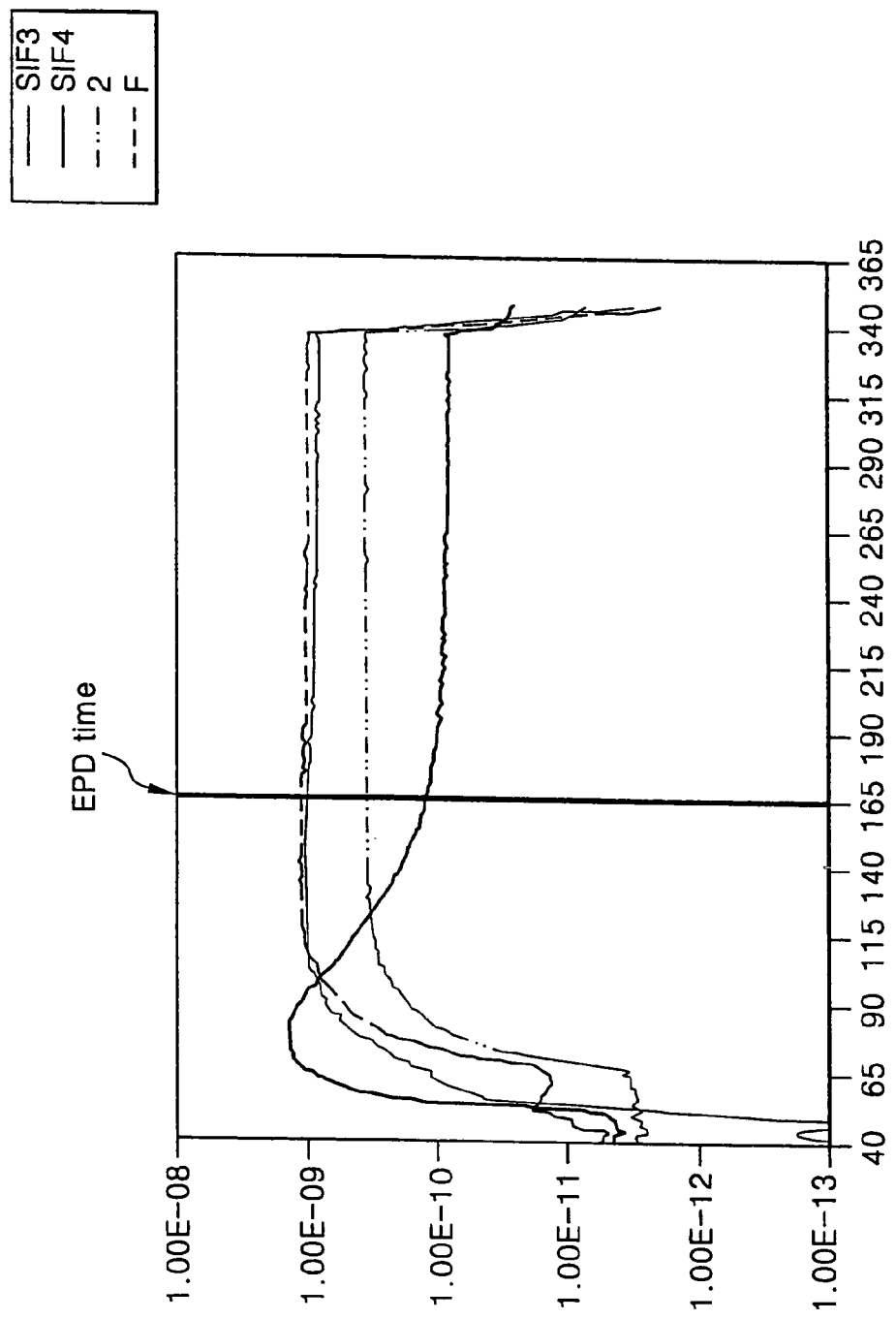
FIG. 13. is a graph showing the measured results of the reaction by-products by employing the gas plasma in accordance with Example 2.

FIG. 12 is a graph showing in an exemplary embodiment, wherein the measured results of the reaction by-products by employing the gas plasma in accordance with the Comparative Example. In yet another exemplary embodiment, FIG. 13 is a graph showing the measured results of the reaction by-products by employing the gas plasma in accordance with Example 2. In FIGS. 12 and 13, the vertical axis indicates the ion concentration, and the horizontal axis represents time.

In FIGS. 12 and 13, the peak level of the $SiF_4$ is greatly reduced after predetermined time. When the reduced amount of the $SiF_4$ is constantly maintained, such a point becomes an end point detection time. As shown in FIG. 12, the peak level of the $SiF_4$ corresponding to the cleaning by-product is constantly maintained for the predetermined time, and is not reduced when the conventional $NF_3$ gas is employed. The cleaning process may be continuously executed in case the peak level of the $SiF_4$ is maintained for the predetermined time. Thus, the total cleaning time was approximately 1,410 seconds.

On the other hand, as shown in FIG. 13, the peak level of the $SiF_4$ is gradually reduced after the predetermined time, such that peak level of the $SiF_4$ is maintained to have a constant value when the cleaning process is performed employing the gas plasma of Example 2. Hence, the point where the peak level of the $SiF_4$ is constantly maintained can be regarded as the end point detection time, because the cleaning by-products cannot be additionally generated. The measured cleaning time was approximately 848 seconds. The measured. results are shown in Table 2.

TABLE 2

|  | Comparative Example | Example 2 |
| --- | --- | --- |
| total cleaning time (second) | 1,410 | 848 |
| employed gas | $NF_3$ gas | $C_3F_8$ gas |
| flow rate | 1,100 | 600 |

Referring to Table 2, the cleaning time of Example 2 using the $C_3F_8$ gas can be reduced by approximately 562 seconds in comparison to the cleaning time of the Comparative Example using the $NF_3$ gas. In addition, the flow rate of the $C_3F_8$ gas is reduced by approximately 45 percent. Furthermore, the manufacturing cost can be reduced because $C_3F_8$ gas is cheaper than $NF_3$ gas.

Gas Decomposition Efficiency with Respect to an Identical Gas

When the $NF_3$ gas is used in the plasma generating apparatus as shown in FIG. 1, the carrier gas (e.g., argon gas having the flow rate identical to that of the $NF_3$ gas) should be employed in order to operate the plasma generating apparatus with low power. Thus, the cleaning efficiency of the plasma may not increase because the flow rate of the $NF_3$ gas may not have more than a predetermined value due to the argon gas.

Figure 14:
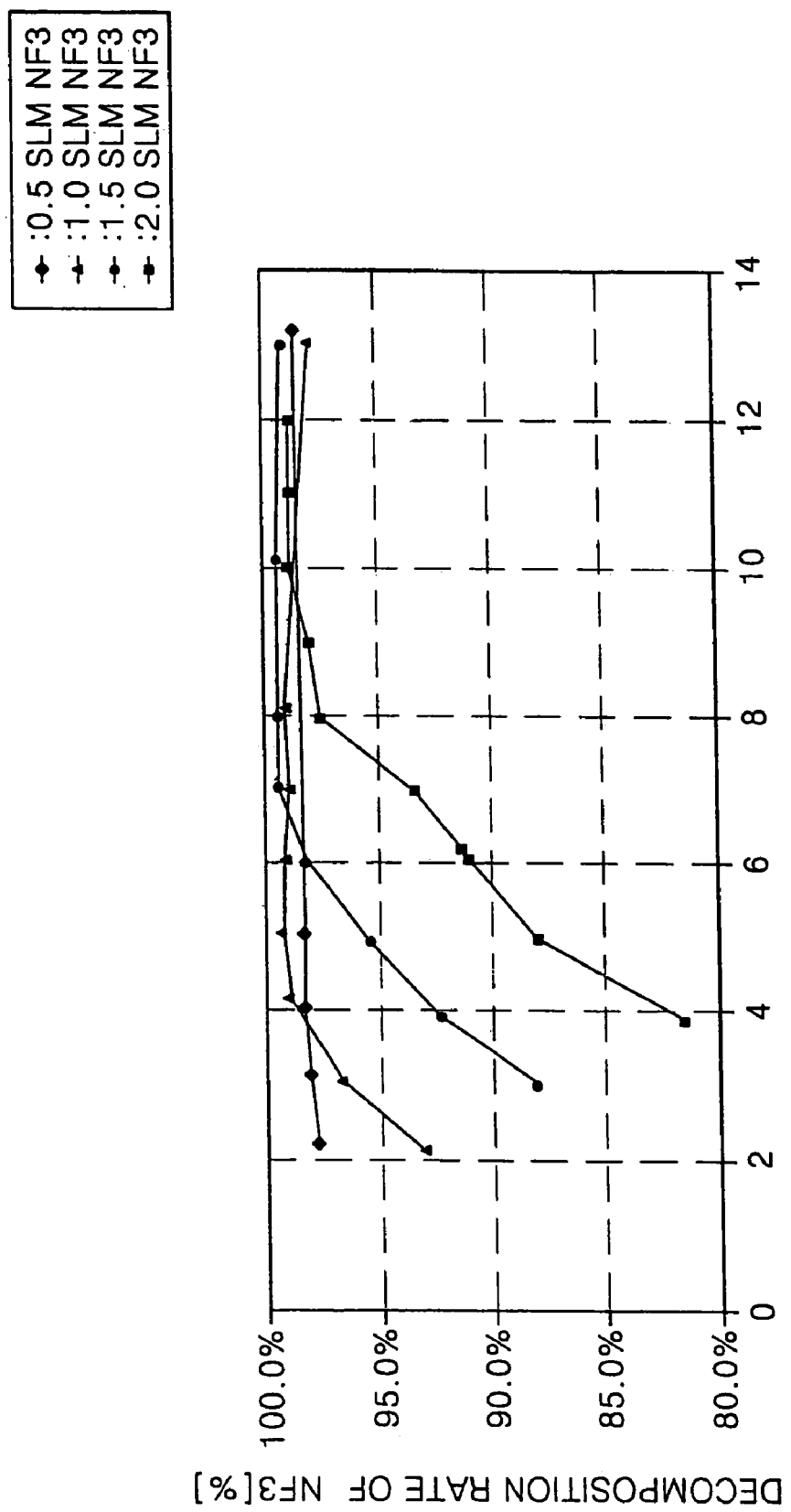
FIG. 14 is a graph showing the decomposition rate of the $NF_3$ gas relative to flow rate in the exemplary plasma generating device shown in FIG. 1.

FIG. 14 is a graph showing the decomposition rate of the $NF_3$ gas relative to flow rate in the plasma generating device in FIG. 1. As shown in FIG. 14, when the flow rate of the $NF_3$ gas increases, the pressure of the chamber also increases so that the pressure of the chamber cannot be controlled to have a pertinent value. Also, the initial decomposition rate of the $NF_3$ gas is reduced, thereby increasing the ignition time of the plasma.

Figure 15:
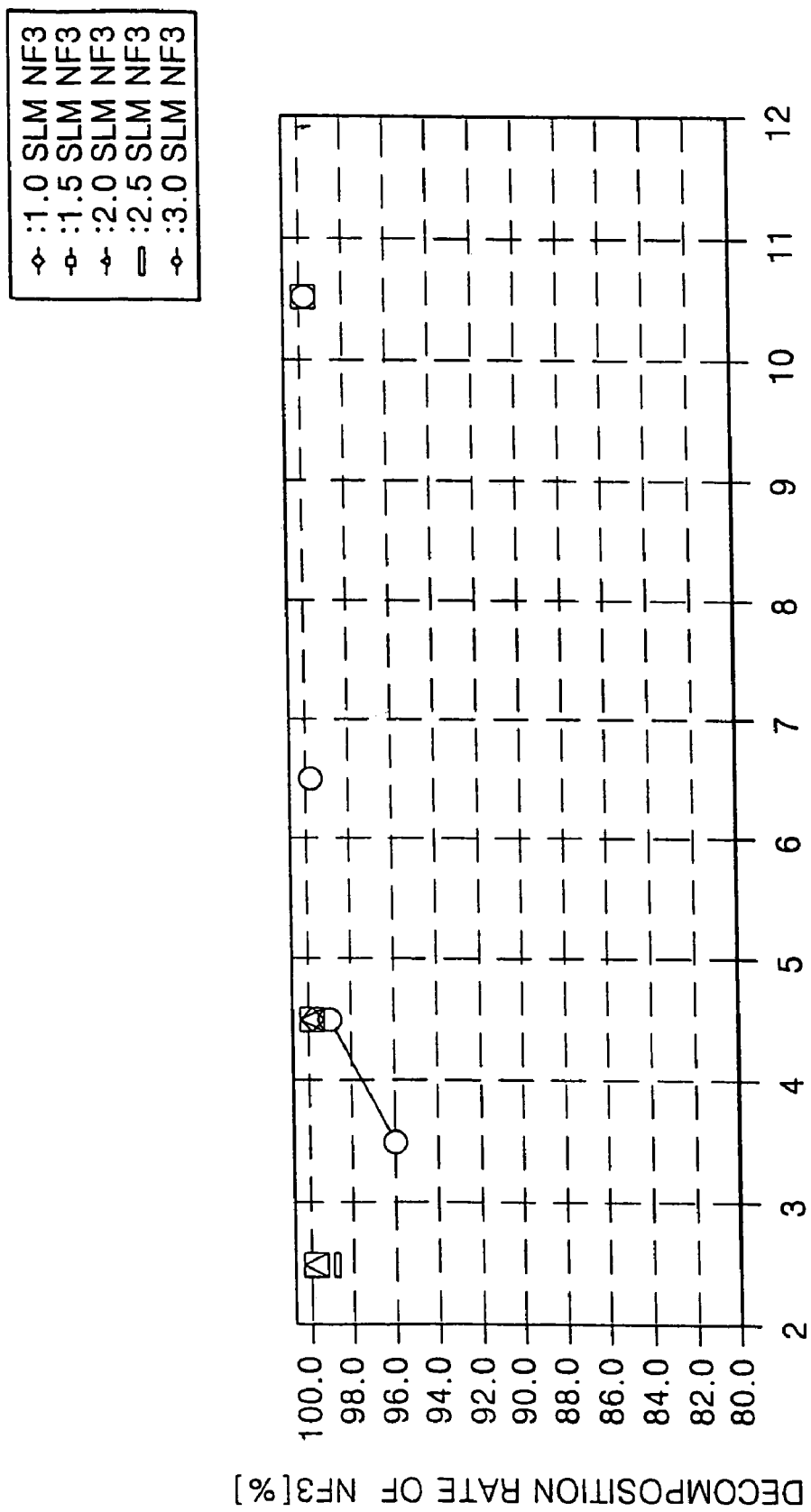
FIG. 15 is a graph showing the decomposition rate of the $NF_3$ gas relative to flow rate in the exemplary plasma-generating device shown in FIG. 3.

FIG. 15 is a graph showing another exemplary embodiment, wherein the decomposition rate of the $NF_3$ gas relative to the flow rate in the plasma generating device in FIG. 3.

Referring to FIG. 15, the decomposition rate of the $NF_3$ gas has a high value of more than approximately 95 percent in the wide range of the pressure, and also the decomposition efficiency of the $NF_3$ gas shows a high value when the flow rate of the $NF_3$ gas increases to approximately 3,000 sccm. Furthermore, the plasma can be sufficiently employed in cases when the ratio of the flow rate between the $NF_3$ gas and the argon gas is maintained at approximately 3:1.

Generally, the decomposition rate of the $NF_3$ gas is reduced when the flow rate of the $NF_3$ gas is augmented. In addition, the time for generating the plasma is greatly increased. As a result, the efficiency for generating the plasma is reduced with the lapse of time. The plasma generating apparatus of an exemplary embodiment of the present invention may employ a reduced gas flow rate to reduce the manufacturing cost, because the gas flow rate can be controlled. Also, because the decomposition rate of the $NF_3$ gas can be approximately 99 percents under the low initial pressure, the flow rate of the $NF_3$ gas can be reduced. Furthermore, the plasma generating apparatus of exemplary embodiments of the present invention can achieve natural ignition of the argon gas so that an additional ignition device is not required.

According to an exemplary embodiment of the present invention, the efficiency of the process for generating the plasma can be improved, and the time for generating the plasma can be shortened when the plasma is generated by the remote method. As a result, the productivity of the process for manufacturing the semiconductor device can be enhanced when the plasma is employed.

In particular, because an inexpensive gas like the $C_3F_8$ gas can be used for manufacturing the semiconductor device, the manufacturing cost of the semiconductor device can be reduced.

Having described the exemplary embodiments of the present invention, it is noted that various modifications and variations can be made by persons skilled in the art in light of the above teachings. It is therefore to be understood that changes may be made in the particular embodiments of the present invention disclosed, which are within the scope and the spirit of the invention, further outlined by the appended claims.

What is claimed is:

1. A method for manufacturing a semiconductor device comprising:
    forming a main magnetic field having an axis, and forming a subsidiary magnetic field substantially parallel to the axis;
    applying an alternating current along a path between the main and the subsidiary magnetic fields;
    allowing a gas to flow along a flow path along the path of the current so that a gas plasma is generated from the gas;
    providing the gas plasma into a chamber separated from a position where the gas plasma is generated; and
    performing a process for manufacturing a semiconductor device by employing the gas plasma.

2. The method for manufacturing a semiconductor device of claim 1, wherein the process for manufacturing the semiconductor device is an etching process in which films formed on a substrate are etched using the gas plasma.

3. The method for manufacturing a semiconductor device of claim 1, wherein the process for manufacturing the semiconductor device is a deposition process in which films are formed on a substrate using the gas plasma.

4. The method for manufacturing a semiconductor device of claim 1, wherein the process for manufacturing the semiconductor device is a cleaning process in which remaining reaction by-products in the chamber are removed from the chamber using the gas plasma.

5. The method for manufacturing a semiconductor device of claim 1, wherein the gas includes a gas including fluorine, and the gas plasma includes fluorine radicals.

6. The method for manufacturing a semiconductor device of claim 5, wherein the gas includes $NF_3$ gas or $C_xF_y$ wherein x>0 and y>0.

7. The method for manufacturing a semiconductor device of claim 1, wherein the gas includes $C_3F_8$ gas. oxygen gas, and argon gas.

8. A method for manufacturing a semiconductor device comprising:
   forming a magnetic field having an axis, and a first subsidiary magnetic field with respect to the magnetic field;
   allowing a gas to flow along a direction substantially perpendicular to the axis of the magnetic field;
   applying an electric field generated from an alternating current along a direction along a flow path of the gas so that a plasma is generated from the gas;
   providing the gas plasma into a chamber separated from a position where the gas plasma is generated; and
   performing a process for manufacturing a semiconductor device employing the gas plasma.

9. The method for manufacturing a semiconductor device of claim 8, further comprising
   forming a second subsidiary magnetic field that is symmetrical to the first subsidiary magnetic field, wherein
   the first and second subsidiary magnetic fields are substantially parallel to the magnetic field.

10. The method for manufacturing a semiconductor device of claim 8, wherein the alternating current is forwardly or reversely applied along a direction substantially parallel to the flow path of the gas.

11. The method for manufacturing a semiconductor device of claim 8, wherein the gas includes a gas including fluorine, oxygen gas, and argon gas.

* * * * *